United States Patent [19]

Hanes et al.

[11] 4,291,329

[45] Sep. 22, 1981

[54] THYRISTOR WITH CONTINUOUS RECOMBINATION CENTER SHUNT ACROSS PLANAR EMITTER-BASE JUNCTION

[75] Inventors: Maurice H. Hanes, Murrysville; Earl S. Schlegel, Plum, both of Pa.

[73] Assignee: Westinghouse Electric Corp., Pittsburgh, Pa.

[21] Appl. No.: 71,631

[22] Filed: Aug. 31, 1979

[51] Int. Cl.³ .............................. H01L 29/167
[52] U.S. Cl. ............................. 357/64; 357/38; 357/91
[58] Field of Search .............. 357/38, 64, 91, 29

[56] References Cited

U.S. PATENT DOCUMENTS

| | | | |
|---|---|---|---|
| 3,309,585 | 3/1967 | Forrest | 357/34 |
| 3,625,781 | 12/1971 | Joshi et al. | 357/64 |
| 3,810,791 | 5/1974 | Kendall | 357/91 |
| 3,888,701 | 6/1975 | Iarneja et al. | 357/91 |
| 3,933,527 | 1/1976 | Iarneja et al. | 357/91 |
| 4,056,408 | 11/1977 | Bartko et al. | 357/38 |

OTHER PUBLICATIONS

A. Fowler, "Cumulative Photovoltaic Device", IBM Tech. Discl. Bull., vol. 4, #10, Mar. 1962, p. 61.

*Primary Examiner*—Joseph E. Clawson, Jr.
*Attorney, Agent, or Firm*—C. L. Menzemer

[57] ABSTRACT

A four-layer semiconductor thyristor including a planar recombination region extending on both sides of a planar cathode-emitter junction.

4 Claims, 4 Drawing Figures

THYRISTOR WITH CONTINUOUS RECOMBINATION CENTER SHUNT ACROSS PLANAR EMITTER-BASE JUNCTION

BACKGROUND OF THE INVENTION

1. Field of the Invention

This invention relates to semiconductor thyristors and, in particular, to semiconductor thyristors having a recombination region therein.

2. Description of the Prior Art

Nearly all large, high power thyristors are made with shunted cathodes to provide for high dv/dt and suitable short turn-off time capabilities. These shunts typically consist of small, localized circular or line-shaped regions in which the cathode metal electrode is shorted to the p-base that under lies the cathode. Their function in the conventional-type thyristor is to decrease the low-current gain of the npn transistor portion so that displacement currents caused by applied dv/dt do not fire the thyristor. Under proper operating conditions, shunting action prevents electron emission from the cathode and the thyristor can continue to block forward voltage.

Discrete shunts take up little of the conducting area when the thyristor is in its normal conducting (high current) state. On the other hand, a thyristor being unintentionally switched by dv/dt-induced current is in a state in which only small areas of the emitter (i.e. those areas farthest from the shunts) carry current, causing a high current density or current crowding in these areas. This concentration of the cathode current increases the emitter efficiency and increases the likelihood that the thyristor will fire prematurely.

SUMMARY OF THE INVENTION

A semiconductor device comprising a body of semiconductor material includes a p-n junction therein. A planar low-lifetime region is disposed about the p-n junction for eliminating current carriers therein.

More particularly, a semiconductor thyristor comprises four adjacent planar layers of semiconductor material having alternate type conductivities such that three metallurgical p-n junctions are formed; one of which metallurgical p-n junctions is a cathode emitter-base junction. In one embodiment, a region having a high concentration of recombination sites extends on both sides of the cathode emitter-base junction. In a second embodiment, a region having a high concentration of recombination sites extends only into the cathode base region of the thyristors.

DESCRIPTION OF THE PREFERRED EMBODIMENT

Figure 1:
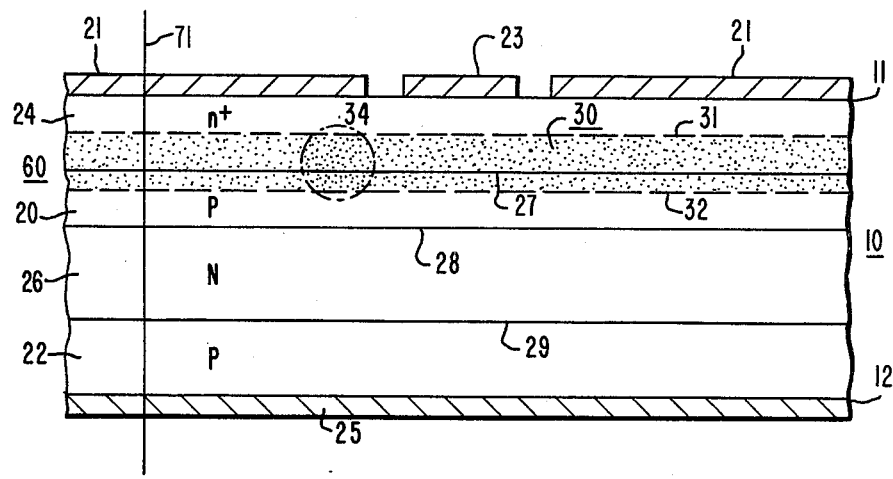
FIG. 1 shows a cross-sectional view of a thyristor according to the teachings of the present invention taken along the lines I—I of FIG. 2.

FIG. 1 shows a cross-sectional view of a thyristor 10 according to the teachings of the present invention. The thyristor 10 includes a top surface 11, a bottom surface 12, and edge 13. Extending between the surfaces 11 and 12 are two p-type layers 20 and 22 of semiconductor material and two n-type layers 24 and 26 of semiconductor material. The layers 20, 22, 24, and 26 are adjacent to each other and alternate in conductivity type such that three p-n junctions 27, 28, and 29 are formed. The p-n junctions 27, 28, and 29 each extend to the edge 13. A 6 $\mu$m thick ring-shaped emitter electrode 21 is disposed on the top surface 11 and a disc-shaped gate electrode 23 having the same thickness as the electrode 21 is disposed on the top surface 11 in the center of the opening in the emitter electrode 21. A 1/16" thick disc-shaped anode electrode 25 covers the entire bottom surface 12.

The n-type layer 24 is approximately 20 $\mu$m thick, has an impurity concentration of approximately $10^{21}$ donors/cm$^3$ and is commonly referred as a cathode-emitter or n-emitter layer. The p-type layer 20 is approximately 30 $\mu$m thick, has an impurity concentration of $10^{18}$ acceptors/cm$^3$ and is commonly referred to as a cathode-base or p-base layer. The n-type layer 26 is approximately 150 $\mu$m thick, has an impurity concentration of $10^{14}$ donors/cm$^3$ and is commonly referred to as an anode-base or n-base layer. The p-type layer 22 is approximately 60 $\mu$m thick, has an impurity concentration of $10^{18}$ acceptors/cm$^3$ and is commonly referred to as an anode-emitter or p-emitter layer. The above common references will be used hereinafter to refer to the layers 20, 22, 24, and 26.

Figure 2:
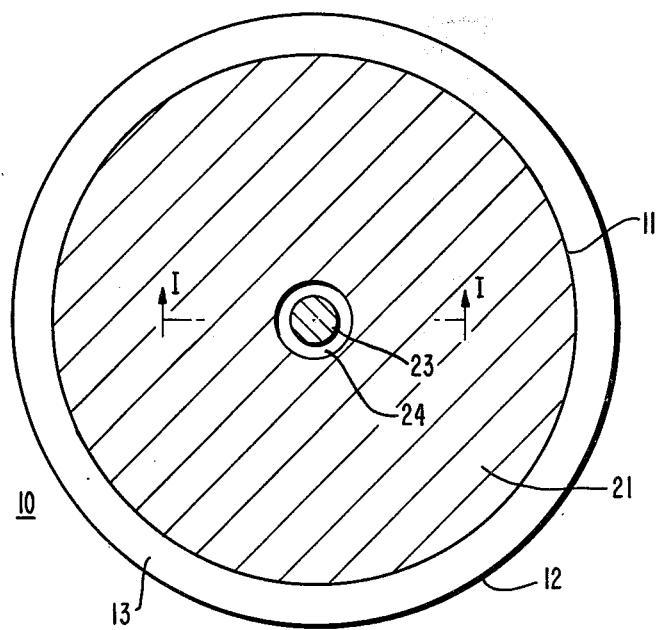
FIG. 2 shows a top surface view of the thyristor of FIG. 1.
Figure 4:
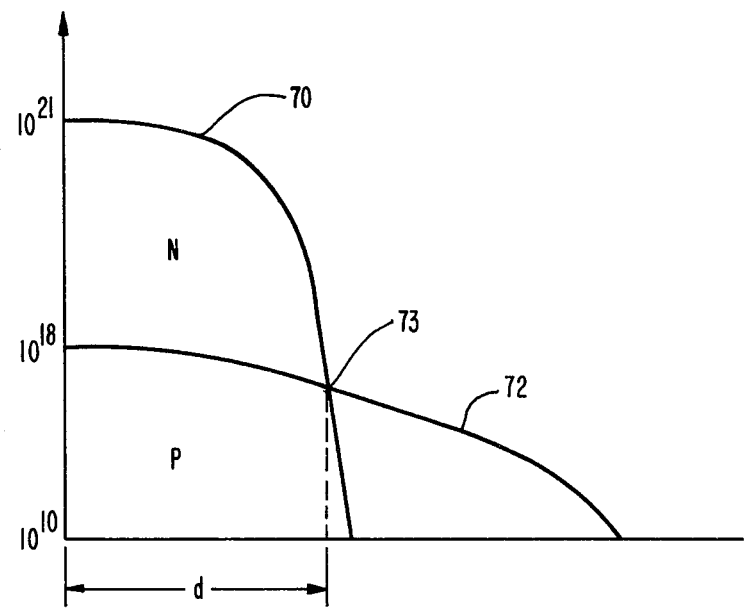
FIG. 4 is a partial graph of impurities concentration in the thyristor of FIGS. 1 and 2.

A planar low-lifetime region, for example a recombination region shown by the stippled area at 30, extends a distance of approximately 10–20 $\mu$m from the p-n junction 27 into the n-type layer 24 towards the top surface 11 as designated by the dashed lines at 31. The recombination region 30 also extends approximately 10–20 $\mu$m from the p-n junction 27 into the p-type layer 20 toward the bottom surface 12 as shown by the dashed lines at 32. The extending of the region 30 into the cathode-base layer 20 can be greater or less than 10–20 $\mu$m but should be at least far enough (approximately 2 $\mu$m) to have an area concentration sufficient to recombine a substantial level of carrier current at low levels of current on the order of 1A but no so far as to extend into the electric field created in the p-base 20 adjacent to the p-n junction 28 which is anticipated at maximum voltage blocking conditions when the thyristor 10 is turned-OFF. Such a condition, i.e., the region 30 extending into the electric field, would cause degraded device performance since electron-pole pairs generated at the recombination centers separate in the presence of an electric field and would appear as a leakage current. The extending of the region 30 into the cathode-emitter layer 24 can be greater or less than 10–20 $\mu$m but generally can be as narrow as possible and even zero $\mu$m. A 0 $\mu$m width, however, is impractical since it is of the utmost importance that the region 30 begin at the p-n (emitter) junction 27 and extend into the p-base layer 20. Modern processing methods are not so accurate as to assure such a condition without affecting at least some of the emitter layer 24 above the p-n emitter junction 27. The recombination region 30 is characterized by an essentially uniform, high density of recombination sites on the order of $10^{15}$/cm$^2$ in order to recombine electrons passing therethrough in direct relationship to the density of recombination sites. FIG. 2 shows a top view of the transistor 10 and from which view FIG. 1 is taken along the lines I—I. The p-n junction 27 referred to herein is the metallurgical junction at which the p-type and n-type impurity concentrations are equal. This junction location is illustrated graphically by the graph of FIG. 4 having as an abscissa the distance from the top surface 11 and having as an ordinate the impurity concentration in the semiconductor material in units of particles/cm$^3$. A curve 70 plots the n-type impurity concentration as a function of distance from the top surface 11 toward the bottom surface 12, for example; along a line 71 in FIG. 1 perpendicular to the surface 11. A curve 72 plots the p-type impurity concentration as a function of distance from the top surface 11 toward the bottom surface 12 along the line 71 in FIG. 2. At a point 73 a distance d from the top surface 11, the metallurgical junction 27 is located where the n-type and p-type impurity concentrations are equal.

Figure 3:
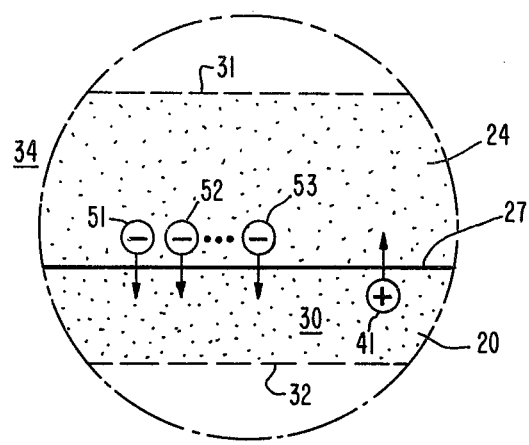
FIG. 3 is an enlargement of a section of the thyristor of FIG. 1.

In explaining the operation of the thyristor 10 of FIG. 1, FIG. 3 is used. FIG. 3 shows a section 34 of the transistor 10 as shown in FIG. 1. A potential $V_1$ is placed across the electrodes 21 and 25 and the potential $V_1$ is blocked by the p-n junction 28. As each minority carrier (hole) crosses the p-n junction 28, transistor action causes an injecting of many electrons across the p-n junction 27 into the cathode-base layer 20 according to the gain of a npn transistor 60 formed by the layers 24, 20, and 26. This transistor action tends ordinarily to forward bias the p-n junction 27 and is shown in FIG. 3 by a hole 41 traveling across the p-n junction 27 as indicated by the associated arrow and a number of electrons, for example, electrons 51, 52, and 53 being injected across the p-n junction 27 into the cathode-base layer 20 as indicated by the associated arrows. When the electrons, for example 51, 52, and 53, cross into the cathode-base layer 20, however, many of them are recombined in the region 30, substantially decreasing the gain or emitter efficiency of the transistor 60 at low current levels and avoiding the increase in low-current emitter efficiency caused by current crowding in conventional discrete-shunt thyristors at high levels of current, for example, when the thyristor 10 is ON, the recombining effect of the region 30 is rendered insubstantial in relation to the high-level current.

The recombination region 30 can be created by irradiating a finished thyristor with high energy particles such as alpha particles or protons. The particles should be accelerated to a high enough velocity in appropriate apparatus such as a Van de Graaff accelerator in order to impart to the particles an energy sufficient to penetrate to the required depth into the cathode-emitter layer 24 and/or the cathode-base layer 20. It is well known that such penetration produces crystal damage confined to a fairly narrow range corresponding to the maximum penetration depth, and that the maximum penetration depth is controlled by regulating the energy of the irradiating particles.

While the invention has been described in its preferred embodiment, it is to be understood that the words which have been used are words of description, not words of limitation and that changes may be made within the scope of the appended claims without departing from the true scope and spirit of the invention in its broader aspects.

It will be appreciated by those skilled in the art that the present invention may be carried out in various ways and may take various forms and embodiments other than the illustrative embodiments heretofore described. For example, the recombination region 30 is, broadly, a low-lifetime region and the scope of the invention is intended to cover any means of creating or maintaining a low-lifetime region having a location as described herein referring to the region 30. More specifically, the particles contemplated to be used in irradiating the thyristor 10 according to the teachings of the present invention are the group of sub-atomic particles or ions which cause lattice damage in semiconductor crystal material only in a region having predetermined dimensions, especially thickness. Proton or alpha particle irradiation is only exemplary of the broader class of possible particles.

Since still other structural variations are possible, it is to be understood that the scope of the present invention is not limited by the details of the foregoing description but will be defined in the following claims.

What we claim is:

1. A semiconductor thyristor comprising:
    (a) top and bottom surfaces;
    (b) a first layer of semiconductor material adjacent to said top surface;
    (c) a second layer of semiconductor material adjacent to said first layer of semiconductor material and forming a first metallurgical p-n junction therewith;
    (d) a third layer of semiconductor material adjacent to said second layer of semiconductor material and forming a second metallurgical p-n junction therewith;
    (e) a fourth layer of semiconductor material adjacent to said third layer of semiconductor material and adjacent to said bottom surface and forming a third metallurgical p-n junction with said third layer of semiconductor material; and
    (f) a recombination region extending only about said first metallurgical p-n junction and spaced apart from said top surface and from said second metallurgical p-n junction, said recombination region having a predetermined concentration of lattice dislocation therein for eliminating current carriers therein.

2. A semiconductor thyristor according to claim 1: wherein said predetermind dislocation concentration is $10^{14}$ recombination sites/cm$^2$.

3. A semiconductor thyristor according to claim 2 wherein said first, second, third, and fourth densities of recombination sites are each at least two orders of magnitude less than said fifth density of recombination sites.

4. A semiconductor thyristor comprising:
    (a) top and bottom surfaces;
    (b) a first planar layer of semiconductor material adjacent to said top surface, said first layer having a thickness of 20 $\mu$m and having a first density of recombination sites;
    (c) a second planar layer of semiconductor material adjacent to said first layer and forming a first metallurgical p-n junction therewith, said second layer having a thickness of 30 $\mu$m and having a second density of recombination sites, said first p-n junction spaced-apart from said top surface by only a layer of semiconductor material having a first conductivity;
    (d) a third planar layer of semiconductor material adjacent to said second layer of semiconductor material and forming a second metallurgical p-n junction therewith, said third layer of semiconductor material having a thickness of 150 $\mu$m and having a third density of recombination sites;

(e) a fourth planar layer of semiconductor material adjacent to said third layer of semiconductor material and adjacent to said bottom surface and forming a third metallurgical p-n junction with said third layer of semiconductor material, said fourth layer of semiconductor material having a thickness of 60 $\mu$m and having a fourth density of recombination sites; and (f) a planar recombination region intersecting with and extending a distance of 10 $\mu$m from said first metallurgical p-n junction toward said bottom surface, said recombination region having a fifth density of recombination sites therein.

* * * * *